United States Patent
Dams

(10) Patent No.: US 8,803,644 B2
(45) Date of Patent: Aug. 12, 2014

(54) MAGNETIC ACTUATOR

(75) Inventor: Johannes Adrianus Antonius Theodorus Dams, Veldhoven (NL)

(73) Assignee: J. Dams Beheer B.V., Veldhoven (NL)

( * ) Notice: Subject to any disclaimer, the term of this patent is extended or adjusted under 35 U.S.C. 154(b) by 0 days.

(21) Appl. No.: 12/864,650

(22) PCT Filed: Jan. 26, 2009

(86) PCT No.: PCT/NL2009/050037
§ 371 (c)(1),
(2), (4) Date: Nov. 30, 2010

(87) PCT Pub. No.: WO2009/093907
PCT Pub. Date: Jul. 30, 2009

(65) Prior Publication Data
US 2011/0057755 A1    Mar. 10, 2011

(30) Foreign Application Priority Data

Jan. 25, 2008  (NL) .................................. 2001216

(51) Int. Cl.
*H01F 7/00*     (2006.01)
(52) U.S. Cl.
USPC .......................................... 335/229; 335/266
(58) Field of Classification Search
USPC .................................................. 335/229, 268
See application file for complete search history.

(56) References Cited

U.S. PATENT DOCUMENTS

| | | | | |
|---|---|---|---|---|
| 3,690,191 A | * | 9/1972 | Ott et al. | 74/142 |
| 3,870,931 A | * | 3/1975 | Myers | 361/194 |
| 4,314,295 A | * | 2/1982 | Frandsen | 360/266.9 |
| 4,612,592 A | * | 9/1986 | Frandsen | 360/266.9 |
| 4,628,907 A | * | 12/1986 | Epley | 600/25 |
| 4,710,656 A | * | 12/1987 | Studer | 310/51 |
| 4,959,629 A | * | 9/1990 | Luetzow | 335/228 |
| 5,345,206 A | * | 9/1994 | Morcos | 335/222 |
| 5,434,549 A | * | 7/1995 | Hirabayashi et al. | 335/229 |
| 5,719,451 A | * | 2/1998 | Cook et al. | 310/12.27 |
| 5,736,800 A | * | 4/1998 | Iannello et al. | 310/90.5 |
| 5,894,263 A | * | 4/1999 | Shimakawa et al. | 340/388.1 |
| 6,039,014 A | * | 3/2000 | Hoppie | 123/90.11 |
| 6,417,583 B1 | * | 7/2002 | Okada | 310/12.25 |
| 6,472,968 B1 | * | 10/2002 | Ohya | 335/229 |
| 6,507,257 B2 | * | 1/2003 | Mohler | 335/220 |
| 6,642,825 B2 | * | 11/2003 | Ohya | 335/229 |
| 6,712,907 B1 | * | 3/2004 | Pratt et al. | 118/719 |
| 6,850,138 B1 | * | 2/2005 | Sakai | 335/222 |
| 7,070,398 B2 | * | 7/2006 | Olsen et al. | 417/353 |

(Continued)

FOREIGN PATENT DOCUMENTS

| | | |
|---|---|---|
| EP | 1 265 105 | 12/2002 |
| EP | 1 424 767 | 6/2004 |
| EP | 1 524 556 | 4/2005 |

*Primary Examiner* — Shawki S Ismail
*Assistant Examiner* — Lisa Homza
(74) *Attorney, Agent, or Firm* — Eric Karich

(57) ABSTRACT

A magnetic actuator has a static part and a dynamic part concentrically arranged therein. The static part comprises two permanent magnets and the dynamic part comprises two further permanent magnets. The magnet is oppositely oriented to the further magnets. The magnets are tuned to each other in such a way that the gravity on the dynamic part is compensated by the magnetic force on the dynamic part. The static part further includes a coil with which an additional magnetic field can be generated by which the actuation force can be adapted.

7 Claims, 3 Drawing Sheets

(56) References Cited

U.S. PATENT DOCUMENTS

| | | | |
|---|---|---|---|
| 7,323,961 B2 * | 1/2008 | Drevet | 335/229 |
| 7,504,921 B2 * | 3/2009 | Vranish | 335/302 |
| 7,517,721 B2 * | 4/2009 | Ito et al. | 438/106 |
| 7,599,510 B2 * | 10/2009 | Ueda et al. | 381/396 |
| 2002/0039060 A1 * | 4/2002 | Maruyama | 335/220 |
| 2002/0050898 A1 * | 5/2002 | Olsson | 335/220 |
| 2003/0006870 A1 * | 1/2003 | Ohya | 335/220 |
| 2005/0001704 A1 * | 1/2005 | Maruyama | 335/220 |
| 2005/0094118 A1 * | 5/2005 | Dams | 355/53 |
| 2008/0204174 A1 * | 8/2008 | Ito et al. | 335/222 |

* cited by examiner

MAGNETIC ACTUATOR

FIELD OF THE INVENTION

The invention relates to a magnetic actuator comprising a first part and a second part concentrically arranged therein, which parts are axially mutually movable, one of the parts being static and the other part being dynamic and in which the first part comprises at least one permanent magnet and the second part comprises at least two further permanent magnets which are present behind one another in axial direction and whose polarisations are in essence each other's opposites. The dynamic part is here understood to be the part that is connected to the object or the environment whose gravity is to be compensated.

Magnetic actuators of this type are used among other things for suspending component parts of machines which are to be positioned and/or displaced in a very accurate way. The magnetic actuator generates a setting force for setting the position or compensating a force (for example gravity) or both. The static part is then connected to the firm object, for example the frame of a machine.

STATE OF THE ART

A magnetic actuator of this type is known from EP-A-1 424 767. With this known magnetic actuator the magnitude of the actuation force can be adjusted by varying the distance between the two further magnets. This is effected by means of a piezo element that is present between the two further magnets. Such a piezo element can displace the two further magnets only over a relatively small distance away from each other and towards each other and thus generate no more than a relatively slight increase or reduction of force.

SUMMARY OF THE INVENTION

It is an object of the invention to provide a magnetic actuator of the type defined in the opening paragraph with which the dynamic part can be displaced over a relatively large distance in a simple manner. To this end the magnetic actuator according to the invention is characterised in that one of the parts includes a coil for generating an additional magnetic field. By regulating the current flowing through the coil, the magnitude of the additional magnetic field and thus the actuation force can be adapted.

In this respect the magnets are tuned to each other in such a way that the gravity on the dynamic part is substantially completely compensated by the magnetic force on the dynamic part. If necessary, additional mass is added to the dynamic part, the mass being tuned to the real bias force. The bias force that is generated by the magnets changes only little when the dynamic magnets are displaced relative to the static magnets. This causes the magnet system to have a low magnetic rigidity. The variation of the magnetic bias force (magnetic rigidity) of the system used is so low that in combination with the mass of the dynamic part (including any added mass) a very low eigenfrequency is provided.

The construction of the magnetic actuator according to the invention is very robust because only the magnets move and no electric wires need to be connected to the dynamic part. As a result of the two oppositely directed axial magnets generating a more or less radial magnetic field at the gap between the two magnets it is not necessary to use radially magnetised rings so that the manufacturing cost can remain low. Furthermore, the radial clearance occurring between the part and the coils provides that any radial stroke is not directly mechanically constrained. If necessary, the magnetic actuator can be included in a control system in which oscillation is measured and sent to a control unit which drives the magnetic actuator by means of the coils, so that the dynamic part starts causing an oscillation that is contrary to the oscillation of the machine component and thus damps/suppresses the vibration. This requires the mass of the dynamic part to be large.

An embodiment of the magnetic actuator according to the invention is characterised in that the first part comprises in addition to said first magnet a second magnet whose polarisation is equal to that of the first magnet. The magnets may then simply be manufactured from one block so as to obtain a minimised spread in material properties.

A further embodiment of the magnetic actuator according to the invention is characterised in that the second part further comprises a third further magnet, the middle one of the further magnets having a different orientation from the two outer further magnets. Then the first part preferably comprises a third magnet, which three magnets have the same orientation direction. As a result the required vertical bias force can be reduced to zero substantially completely and thus be precisely tuned to the moving mass of the dynamic part.

A still further embodiment of the magnetic actuator according to the invention is characterised in that the second part further comprises a fourth magnet, the two middle further magnets having a different orientation from the two outer further magnets. As a result, the magnetic bias forces are mutually oppositely directed and eliminate each other. In consequence, the required vertical bias force can be reduced to zero substantially completely and thus be precisely tuned to the moving mass of the dynamic part. Then the first part preferably comprises also a fourth magnet, the four magnets having the same orientation direction.

In addition, preferably the first part is static and the second part is dynamic, the dynamic part being arranged in the static part and the coil being part of the static part.

Yet a further embodiment of the magnetic actuator according to the invention is characterised in that between the two parts there is at least one coil or electric conductor present in the magnetic field, which coil or conductor is connected to the static part. This coil is preferably short-circuited by an electric resistor and provides a certain degree of damping of the dynamic part relative to the static part. Depending on the desired damping there are one or more short-circuited coils or electric conductors present. Also a capacitor may be connected to the coil(s) or electric conductor(s) for realising a frequency-dependent damping.

A still further embodiment of the magnetic actuator according to the invention is characterised in that the second part is connected to the first part by means of one or more leaf springs, which leaf spring(s) is(are) relatively rigid in radial direction and slack in axial direction, the magnetic field having a negative rigidity which eliminates the positive axial rigidity of the leaf spring(s) in full or in part, and the sum of the rigidities providing a low eigenfrequency of the moving mass. The purpose of the leaf spring or the leaf springs is to maintain the dynamic radially in the middle.

Preferably, the distance between two magnets which are arranged behind each other in axial direction can be adjusted. This provides that the magnetic force can be adjusted so that among other things the influence of changes in temperature can be compensated.

In order to compensate changes of the magnetic force as a result of the change in temperature of the magnets the materials which one or both parts are made of are preferably tuned to each other so that, in the case of expansion/shrinkage of the parts due to a change in temperature, the axial distance between the magnets and with it the magnetic force changes to such extent that it compensates in full or in part the change in magnetic force resulting from the change in temperature of the magnets. A mechanical readjustment of the vertical distance between the magnets in the form of thread or shims is also possible.

BRIEF DESCRIPTION OF THE DRAWINGS

The invention will be described hereinbelow in more detail based on an example of embodiment of the magnetic actuator according to the invention represented in the drawing figures, in which.

DETAILED DESCRIPTION OF THE DRAWINGS

Figure 1:
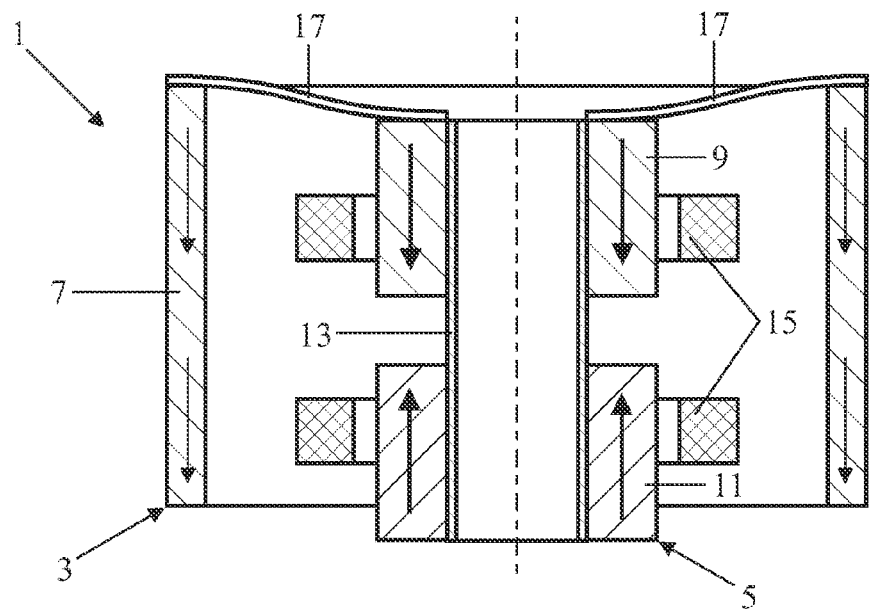
FIG. 1 shows a sectional view of a first embodiment of the magnetic actuator according to the invention comprising three magnets.
Figure 2:
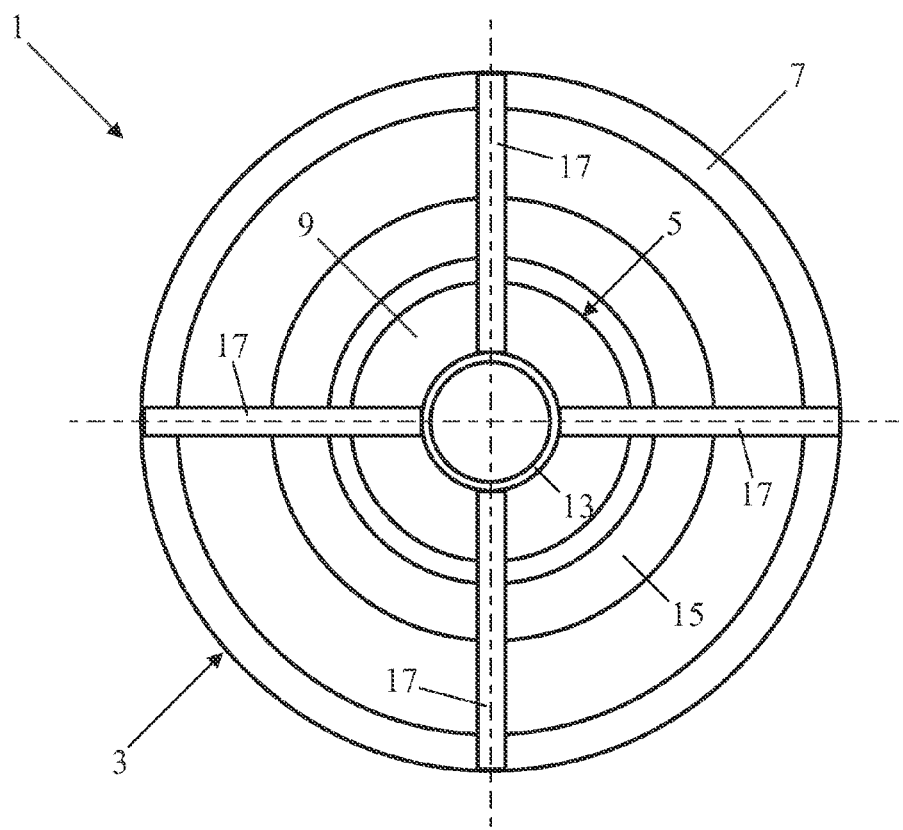
FIG. 2 shows a plan view of the magnetic actuator shown in FIG. 1.

FIGS. 1 and 2 show a sectional view and a plan view respectively of the magnet system of a first embodiment of the magnetic actuator according to the invention. The casing and further component parts of the magnetic actuator have been omitted in these and further drawing figures. The magnetic actuator 1 has a static, first part 3 and a dynamic, second part 5 concentrically arranged therein. These two parts 3 and 5 are axially movable relative to each other.

The static part 3 comprises a permanent magnet 7 where the magnetic flux and thus the North-South orientation through the magnet is indicated by arrows. The dynamic part 5 comprises two further permanent magnets 9 and 11 which are mounted on a cylindrical support 13 and are present at a distance from each other in axial direction. The further permanent magnet 9 here has an orientation that is opposite to that of the further permanent magnets 7 and 11.

The static part 3 comprises two coils 15 for generating additional magnetic fields by which the actuation force can be adapted. The two coils are connected in series and have the same direction of winding and preferably an equal number of windings. The static part 3 may further be provided with a correction coil (not shown in the drawing figures). It is also possible to send a current through this correction coil to generate an additional force to compensate any temperature influences on the magnetic bias force.

The dynamic part 5 is connected to the static part 3 by means of leaf springs 17 (which may be connected to both the top and bottom side of part 5). The purpose of these leaf springs 17 is to radially position the dynamic part relative to the static part. To this end the leaf springs are rigid in radial direction and are slack in axial direction for the benefit of a low eigen frequency. The leaf springs 17 will have a slight axial rigidity but, as a result of this, nevertheless cause a change in axial force between the two parts when the dynamic part is moved relative to the static part. In the case where the magnetic actuator 1 has a negative magnetic rigidity, this undesired axial rigidity of the leaf springs will be compensated in whole or in part.

The construction of the magnetic actuator 1 according to the invention is very robust because only the magnets 9 and 11 are moving and no electric leads need be connected to the dynamic part 5. Because of the two oppositely directed axial magnets 9 and 11, which generate a more or less radial magnetic field at the gap between the two magnets, there is no need to use radially magnetised rings so that the manufacturing cost can remain low. Furthermore, the radial clearance occurring between the part 5 and the coils 15 provides that any radial stroke is not directly mechanically constrained. This may make it possible to work even without leaf springs 17 while the radial clearance between the parts 3 and 5 is to be guaranteed by one or two additional actuators.

Figure 3:
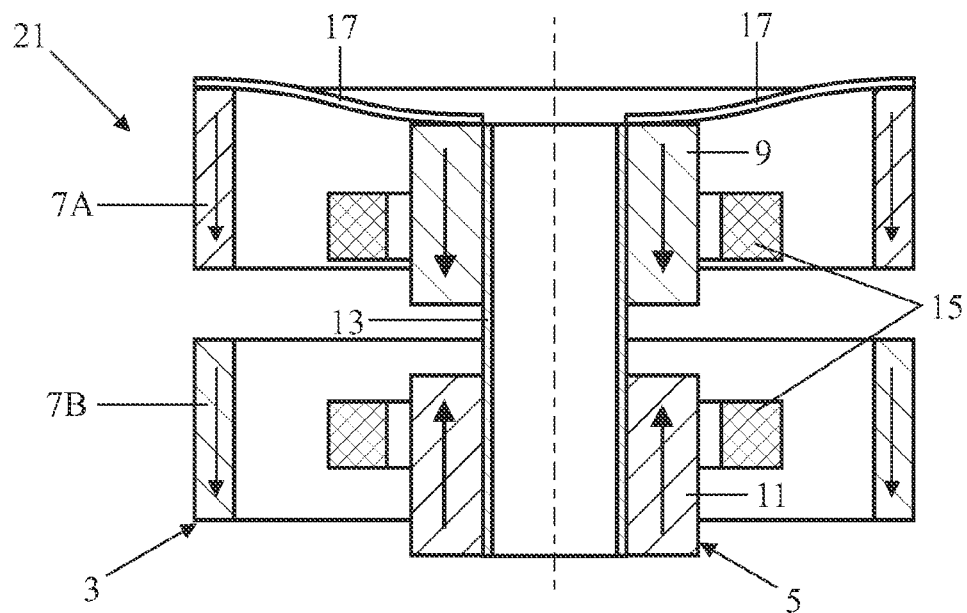
FIG. 3 shows a sectional view of a second embodiment of the magnetic actuator according to the invention comprising four magnets.

FIG. 3 shows a sectional view of a second embodiment of the magnetic actuator according to the invention. All component parts that are equal to those of the first embodiment are indicated by like reference numerals. The static part 3 in this magnetic actuator 21 has two permanent magnets 7A and 7B which are present at a distance to each other in axial direction. By varying the distance between the magnets 7A and 7B and/or the distance between the magnets 9 and 11, the magnetic force can be adjusted. A limited variation in magnetic bias force as a result of a changed distance between the magnets 9 and 11 and/or 7A and 7B will not produce more than a slight change in the rigidity characteristic of the magnetic actuator.

Figure 4:
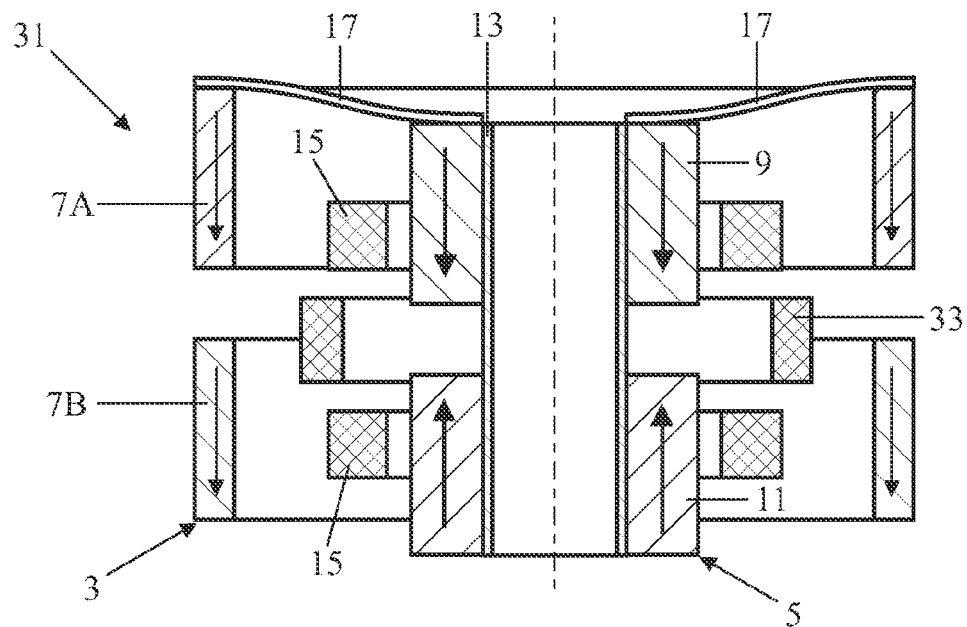
FIG. 4 shows a sectional view of a third embodiment of the magnetic actuator according to the invention comprising a coil for damping of the dynamic part.

FIG. 4 shows a sectional view of a third embodiment of the magnetic actuator according to the invention. All component parts that are equal to those of the first embodiment are indicated by like reference numerals. The static part 3 in this magnetic actuator 31 comprises a short-circuited coil 33. This coil 33 provides the damping of the dynamic part 5 relative to the static part 3.

Figure 5:
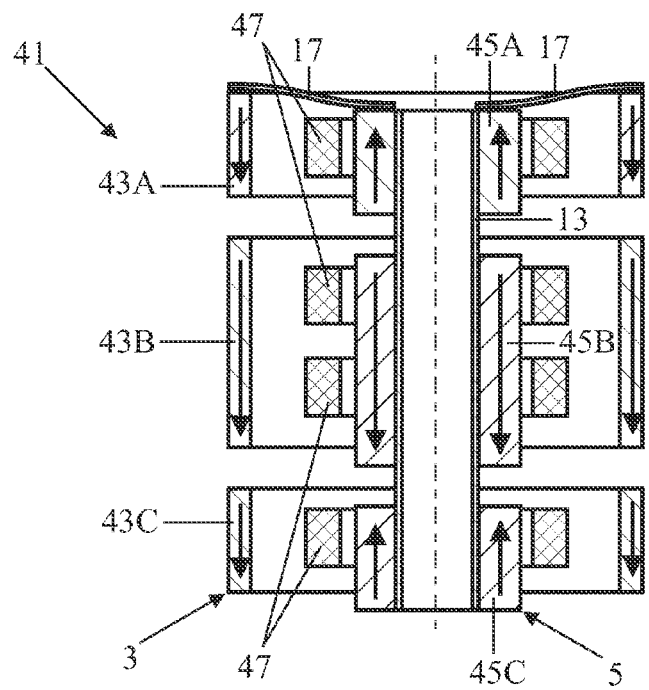
FIG. 5 shows a sectional view of a fourth embodiment of the magnetic actuator according to the invention comprising six magnets.

FIG. 5 shows a sectional view of a fourth embodiment of the magnetic actuator according to the invention. All component parts that are equal to those of the first embodiment are indicated by like reference numerals. This magnetic actuator 41 comprises six magnets, three static magnets 43A-43C and three dynamic magnets 45A-45C. They are capable of substantially fully reducing the vertical bias force to zero and thus exactly tuning this bias force to the moving mass of the dynamic part. In addition it comprises four coils 47. All four coils are connected in series and preferably have an equal number of windings, the upper two coils having a direction of winding opposite to that of the lower two coils. It is alternatively possible to omit the middle two coils or the outer two coils or short-circuit them by means of a resistor or to replace them with an electric conductor and thus provide a certain degree of damping of the dynamic part relative to the static part. Depending on the desired damping there is(are) included one (or more) short-circuited coil(s) or electric conductor(s). It is also possible for a capacitor to be connected to the coil(s) or electric conductor(s) to realise a frequency-dependent damping.

Figure 6:
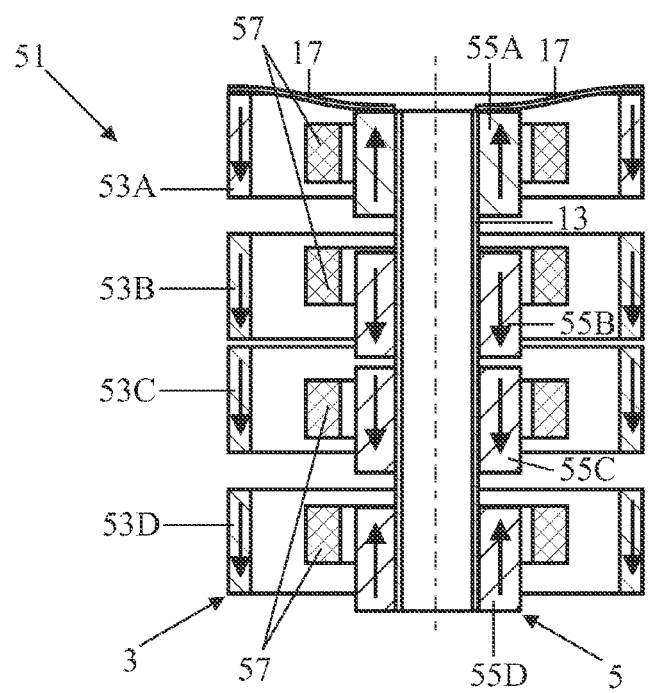
FIG. 6 shows a sectional view of a fifth embodiment of the magnetic actuator according to the invention comprising eight magnets.

FIG. 6 shows a sectional view of a fifth embodiment of the magnetic actuator according to the invention. All component parts that are equal to those of the first embodiment are indicated by like reference numerals. This magnetic actuator 51 comprises eight magnets, four static magnets 53A-53D and four dynamic magnets 55A-55D. It comprises four coils 57 too. The magnet system of this magnetic actuator 51 is a twofold embodiment of the magnet system of the magnetic actuator shown in FIG. 3. The direction of the magnetic field of the upper two dynamic magnets, however, is opposite to that of the lower two dynamic magnets, so that the magnetic bias force is opposite and is eliminated. A more limited magnetic bias force can now be generated again by varying the gap between the magnets 53A-53D and 55A-55D, which will not produce more than a slight change in the rigidity characteristic of the magnetic actuator.

Albeit the invention has been described in the foregoing based on the drawing figures, it should be observed that the invention is not by any manner or means restricted to the embodiment shown in the drawing figures. The invention also extends to all embodiments deviating from the embodiment shown in the drawing figures within the spirit and scope defined by the claims. For example, the outer and inner magnets may also be interchanged leading to different configurations of the magnet systems.

What is claimed is:

1. A magnetic actuator comprising:
a first part and a second part concentrically arranged therein, which parts are axially mutually movable, one of the parts being static and the other part being dynamic and in which the first part comprises at least one permanent magnet, whose polarity is in the axial direction, and the second part comprises at least two further permanent magnets which are present behind one another in axial direction and whose polarisations are in opposite directions, in essence each other's opposites, thereby creating a radial magnetic field component between them, and wherein one of the parts includes a coil for generating an additional magnetic field, wherein the static first part surrounds the dynamic second part, with the coil being located radially between the first part and the second part.

2. A magnetic actuator as claimed in claim 1, wherein the first part is static and the second part is dynamic, the dynamic part being arranged in the static part and the coil being part of the static part.

3. A magnetic actuator as claimed in claim 1, wherein between the two parts there is at least one coil or electric conductor present in the magnetic field, which coil or conductor is connected to the static part.

4. A magnetic actuator as claimed in claim 3, wherein the ends of the coil or electric conductor are connected to each other direct or via a capacitor or resistor.

5. A magnetic actuator as claimed in claim 1, wherein the second part is connected to the first part by means of one or more leaf springs, which leaf spring(s) is(are) relatively rigid in radial direction and slack in axial direction, the magnetic field having a negative rigidity which eliminates the positive axial rigidity of the leaf spring(s) in full or in part, and the sum of the rigidities providing a low eigenfrequency of the moving mass.

6. A magnetic actuator as claimed in claim 1, wherein the distance between two magnets which are arranged behind each other in axial direction can be adjusted.

7. A magnetic actuator comprising:
a first part and a second part concentrically arranged therein, which parts are axially mutually movable, one of the parts being static and the other part being dynamic and in which the first part comprises at least one permanent magnet, whose polarity is in the axial direction, and the second part comprises at least two further permanent magnets which are present behind one another in axial direction and whose polarisations are in essence each other's opposites, thereby creating a radial magnetic field component between them, and wherein one of the parts includes a coil for generating an additional magnetic field, wherein the static first part surrounds the dynamic second part, with the coil being located radially between the first part and the second part; and
wherein the second part is connected to the first part by means of one or more leaf springs, which leaf spring(s) is(are) relatively rigid in radial direction and slack in axial direction, the magnetic field imparting a negative bias which eliminates the positive axial bias of the leaf spring(s) in full or in part, and the sum of the biases providing a low eigenfrequency of the moving mass.

\* \* \* \* \*